United States Patent [19]

Borgen et al.

[11] Patent Number: 5,574,451
[45] Date of Patent: Nov. 12, 1996

[54] DIGITAL CIRCUIT FOR THE INTRODUCTION OF DITHER INTO AN ANALOG SIGNAL

[75] Inventors: Gary S. Borgen, Camarillo; James L. Sullivan, Ventura, both of Calif.

[73] Assignee: The United States of America as represented by the Secretary of the Navy, Washington, D.C.

[21] Appl. No.: 385,526

[22] Filed: Feb. 8, 1995

[51] Int. Cl.⁶ .................................................. H03M 1/20
[52] U.S. Cl. ........................................... 341/131; 341/110
[58] Field of Search ..................................... 341/131, 143, 341/110, 118

[56] References Cited

U.S. PATENT DOCUMENTS

| 4,513,386 | 4/1985 | Glazer | 364/717 |
| 5,311,180 | 5/1994 | Borgen | 341/131 |

Primary Examiner—Jeffrey A. Gaffin
Assistant Examiner—Peguy JeanPierre
Attorney, Agent, or Firm—David S. Kalmbaugh; Melvin J. Sliwka

[57] ABSTRACT

An electronics circuit for digitizing an analog audio data signal into a digital equivalent signal and then introducing digitized nyquist dither data into the digital equivalent signal to substantially eliminate the need for removing the nyquist dither data from the digital equivalent signal prior to its conversion to an analog signal which is a substantial replica of the incoming analog audio or like data signal. The electronics circuit comprises a first pseudo-random number generator which generates a series of digitized nyquist dither bits for addition to the digital equivalent signal. The digitized nyquist dither bits are, in turn, provided by an external computer using a computer program which first generates a pseudo-random sequence of positive integers over a first predetermined range. The computer program implements a high pass filter which processes the pseudo-random sequence of positive integers to generate the digitized nyquist dither bits for use by the programmed read only memory as the dither bits to be added to the digital equivalent signal. A binary adder adds the digitized nyquist dither bits to the digital equivalent signal and then provides the resulting digital equivalent signal with dither to a first clipping circuit. The first clipping circuit clips the digital equivalent signal with dither to a maximum binary value having every bit at the logic one state and a minimum binary value having every bit at the logic zero state.

19 Claims, 8 Drawing Sheets

DIGITAL CIRCUIT FOR THE INTRODUCTION OF DITHER INTO AN ANALOG SIGNAL

BACKGROUND OF THE INVENTION

1. Field of the Invention

The present invention relates generally to the conversion of electric signals from analog to digital form. More specifically, the present invention relates to a digital circuit for translating an analog audio or like analog signal into an equivalent digital signal having a filtered dither signal added thereto which is an artificially created noise signal for reducing noise and distortion.

2. Description of the Prior Art

The pulse code modulation (PCM) or digital processing of analog audio signals has become, or is becoming, the mainstream of high fidelity sound recording and reproduction with the advent and ever increasing commercial acceptance of compact discs. The digital processing of analog signals in the low to high frequency range is also becoming highly useful for analyzing the performance of weapons systems such as guided missiles. For example, the analog data acquired by a guided missile during flight is converted to its digital equivalent and then placed in a digital PCM frame for transmission to a ground station for analysis.

There are, however, some problems left unsolved in the art of digital processing of analog signals. For example, there is a significant difference between the samples of an analog signal and the quantized values of the samples which is generally referred to as "quantization noise". This difference becomes particularly pronounced when the input analog signal is low and there are only a small number of quantization steps, thereby, for example, distorting the reproduced sound as higher harmonics in high fidelity sound systems.

A prior art solution to this quantization noise problem has been the use of dither which is intended to turn the quantization noise into broad band white noise which has little or no effect on reproduced sound or the like and which is generally referred to as "white noise". One system of the prior art adds an analog dither signal, converted from the output from a digital dither generator by a digital to analog converter, to the incoming analog audio or analog data signal. The combined analog data and dither is digitized by an analog to digital converter and then fed to a subtractor circuit. The subtractor is also supplied the digital dither directly from the dither generator. The subtractor circuit then subtracts the dither component from the digital data and dither signal.

A second system of the prior art uses an analog dither generator in combination with a second analog to digital converter for digitizing the analog dither prior to its delivery to the subtractor. In this prior art system, analog dither is added directly to the analog data signal. The resulting dither added data signal is then digitized by the first analog to digital converter and the analog dither is digitized by the second analog to digital converter preparatory to application to the two inputs of the subtractor circuit.

A prior art patent issued to a co-inventor of the present invention, U.S. Pat. No. 5,311,180 entitled "Digital Circuit For The Introduction And Later Removal Of Dither From An Analog Signal" to Gary S. Borgen describes a first pseudo-random number generator which generates digital random noise signals for addition to the digital equivalent signal of an analog audio signal and a second psuedo-random number generator which generates subtractive digital random noise signals for the subsequent removal of dither from the digital equivalent signal prior to its conversion to an analog replica of the analog audio signal.

While partially satisfactory for their intended of purpose of removing noise and distortion from a digitized analog signal, these prior art systems ordinarily leave something to be desired whenever the incoming analog signal is composed of low level sinusoids, often referred to as a low level sinusoidal signal. Low level sinusoidal signals have a spectral content that is highly dependent on and correlated with the frequency of the sinusoids present in the signal. In a spectral analysis of the digital equivalent signal, the quantization noise tends to be centered about the frequency of the signal and its harmonics generating quantization noise which obscures the signal.

With the above and other disadvantages of the prior art the present invention was conceived and one of its objects is to minimize the quantization noise of an incoming analog signal composed of low level sinusoids when the signal is converted to its digital equivalent, while simultaneously minimizing the number of digital bits to accurately represent the analog signal.

It is another object of the present invention to provide a reliable yet relatively simplistic and inexpensive electronics circuit for generating and then adding digital dither bits to an equivalent digital signal.

It is yet a further object of the present invention to provide electronics circuitry which is capable of operation with high resolution and conversion accuracy.

The above and other novel features and advantages of the present invention and the manner of realizing them will become more apparent and the invention will be best understood from a study of the following description and appended claims, with reference to the attached drawings.

SUMMARY OF THE INVENTION

According to the present invention, briefly stated, there is provided an electronics circuit for accurately digitizing an analog audio or like data signal into a digital equivalent signal and then introducing digitized nyquist dither data into the digital equivalent signal to substantially eliminate the need for removing the nyquist dither data from the digital equivalent signal prior to its conversion to an analog signal which is a substantial replica of the incoming analog audio or like data signal. The electronics circuit of the present invention is characterized by a first pseudo-random number generator which may be a programmed read only memory (PROM). The programmed read only memory generates a series of digitized nyquist dither bits for addition to the digital equivalent signal. The digitized nyquist dither bits are, in turn, provided by an external computer using a computer program which first generates a pseudo-random sequence of positive integers over a first predetermined range. The computer program implements a high pass filter which processes the pseudo-random sequence of positive integers to generate the digitized nyquist dither bits for use by the programmed read only memory as the dither bits to be added to the digital equivalent signal.

A binary adder adds the digitized nyquist dither bits to the digital equivalent signal and then provides the resulting digital equivalent signal with dither to a first clipping circuit. The first clipping circuit clips the digital equivalent signal with dither to a maximum binary value having every bit at the logic one state and a minimum binary value having every bit at the logic zero state. The addition of the digitized nyquist dither bits to the digital equivalent signal allows for the conversion of the digital equivalent signal with dither to an analog signal without first removing the dither component.

DETAILED DESCRIPTION OF THE PREFERRED EMBODIMENT

Figure 1:
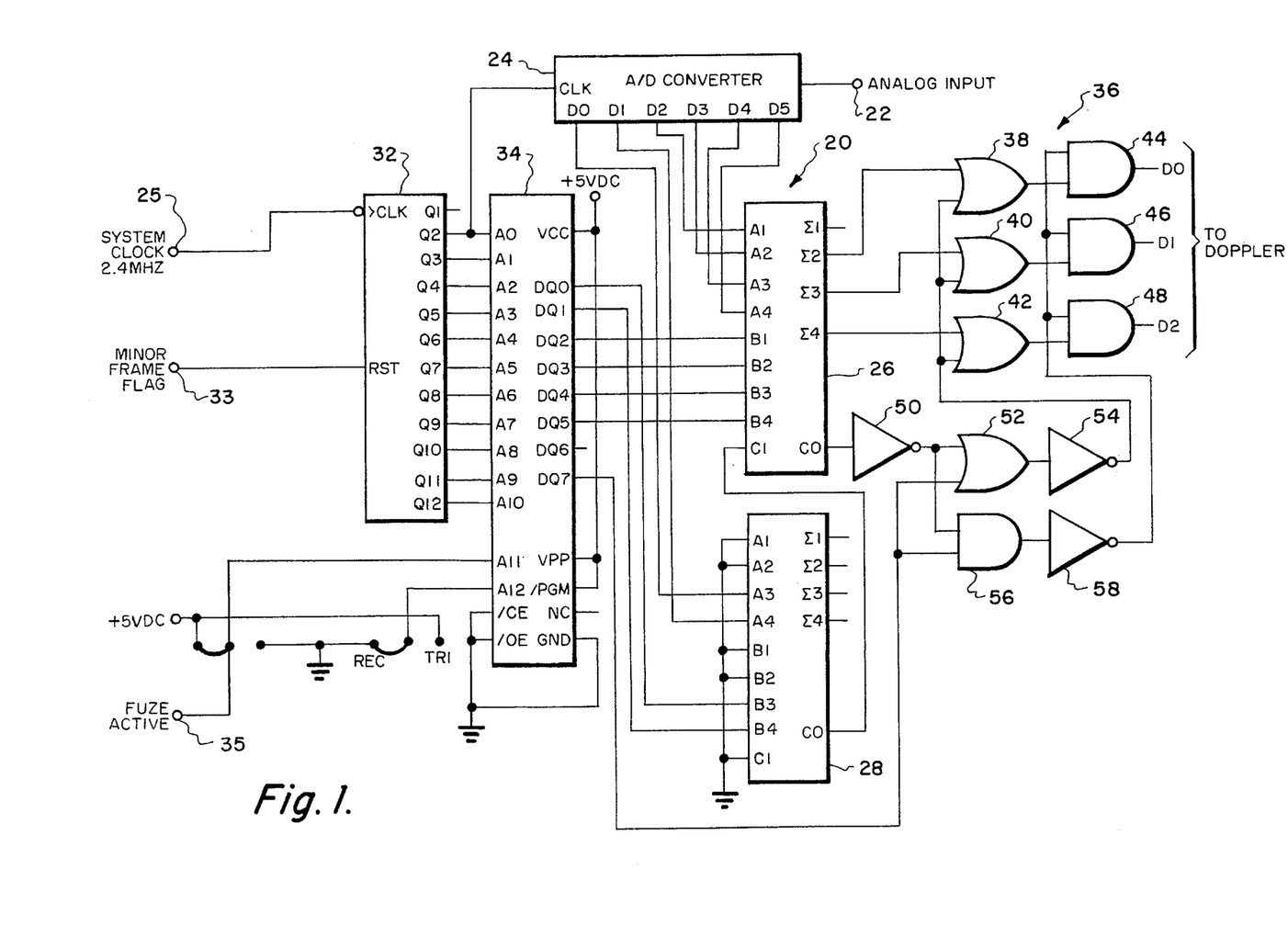
FIG. 1 is a circuit diagram of a digital circuit for the introduction of nyquist dither data to an audio or analog data signal after the signal is digitized.

Referring to FIG. 1, the electronics circuit, designated generally by the reference numeral 20 is adapted for use in the pulse code modulation of an analog data signal, analog audio signal or the like.

The reference numeral 22 in FIG. 1 denotes an input terminal for inputting the analog audio or analog data signal. The analog data/video doppler signal provided to the electronics circuit 20 of the present invention is the tracking information from a missile in flight which is to be digitized and then forwarded via the missile's telemetry unit to a ground station for analysis. However, it should be understood that the term "data signal" may mean any analog signal that can be processed by means of the present invention and which may have a frequency in the low to high frequency range as well as the audio frequency range.

The analog data signal is first provided to an analog to digital converter 24 which converts the analog data signal to an equivalent six bit digital signal or word with the four most significant bits (MSB) of the signal being supplied to the A1–A4 inputs of a four bit binary full adder 26, while the two least significant bits (LSB) of the signal are supplied to the A3 and A4 inputs of a four bit binary full adder 28. The conversion or sampling rate of analog to digital converter 24 is 600 KHz with the 600 KHz sampling/clock signal being supplied to the clock input of analog to digital converter 24 by an asynchronous twelve bit counter 32. It should be noted that the Q2 output of counter 32 is also connected to the clock input of analog to digital converter 24 to provide to converter 24 the 600 Khz clock signal.

At this time, it should be noted that there is a limitation in bandwidth at which the digitized information may be transmitted to the ground station because of National Telecommunications and Information Administration frequency allocation limitations as well as limitations in the ground station's data receiving and processing capabilities. As a result of these limitations electronics circuit 20 provides a maximum three bit digitized word for each six bit digitized sample of the analog data signal supplied to analog to digital converter 24.

A 2.4 megahertz system clock signal from the missile telemetry receiver, bit synchronizer and decommutator, not illustrated, is supplied via terminal 25 to the clock input of asynchronous twelve bit counter 32. The Q2–Q12 outputs of counter 32, in response to the 2.4 megahertz clock signal, supplies 2048 different addresses to the A0–A10 inputs of a pseudo-random number generator 34 which generates a series of digitized nyquist dither bits for addition to the digital equivalent signal provided by analog to digital converter 24.

A personal computer utilizing the computer software program set forth in Appendix A generates 2048 digitized nyquist dither bits which are then loaded into pseudo-random number generator 34.

The computer software of Appendix A uses the following equations to generate a periodic pseudo-random sequence of positive integers, $I_i$ for a range i:=1 . . . 2051:

$$I_i := \mathrm{mod}[[J \cdot [I_{(i-1)}] + 1], M] \quad (1)$$

where $M := 2^{11} = 2.048 \cdot 10^3$ $K := 507$ and $J := 4 \cdot K + 1 = 2.029 \cdot 10^3$ At this time it the computer software program of Appendix A is written in the well known C programming language. It should also be noted that mod(x,y) is the remainder on dividing x by y with the result having the same sign as x. In equation 1 x is $[J \cdot [I_{(i-1)}] + 1]$ and y is M.

Figure 14:
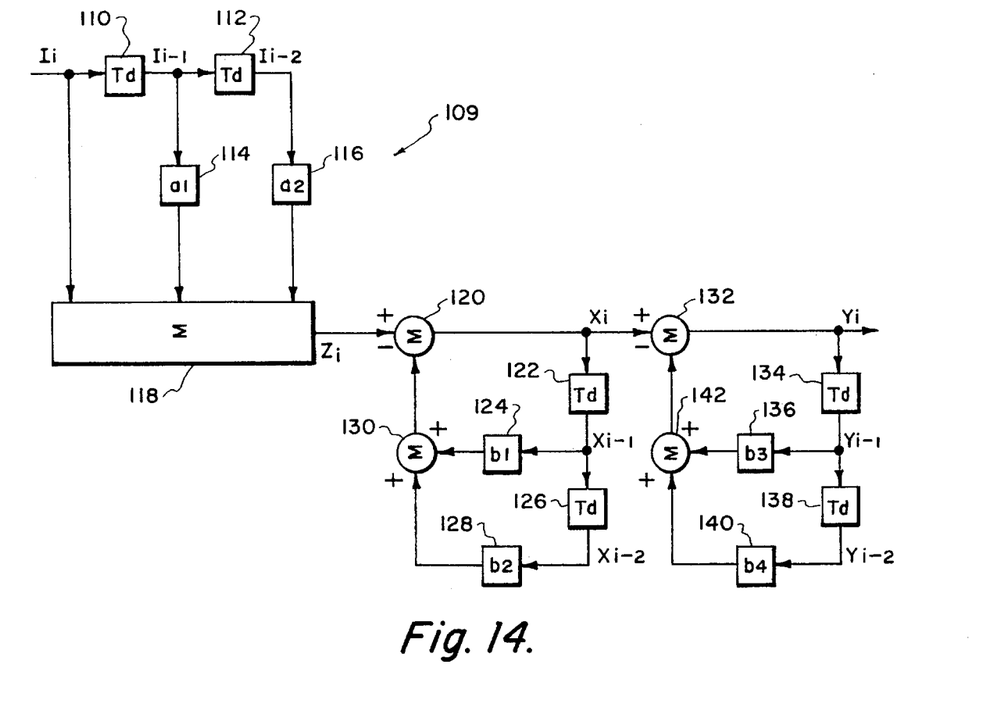
FIG. 14 is a schematic diagram of a high pass filter which will generate the digitized nyquist dither data illustrated in FIG. 12.

The positive integers $I_i$ calculated according to equation 1 are next processed by the high pass filter illustrated in FIG. 14 over a range i:=2 . . . 2050. The output of a summer 118 of a high pass filter 109 of FIG. 14 may be defined by the following equation:

$$z_i = I_i + a1 \cdot I_{i-1} + a2 \cdot I_{i-2} \quad (2)$$

where the output of summer 118 is $z_i$; a1 is a constant multiplier 114 having a value of 0.58899921; a2 is a constant multiplier 116 having a value of 0.64; time delay 110 delays the calculated value of $I_i$ from equation 1 by one time period and time delay 112 delays the calculated value of $I_i$ from equation one by two time periods.

The output of a summer 120 of high pass filter 109 may be defined by the following equation:

$$x_i = z_i - b1 \cdot x_{i-1} - b2 \cdot x_{i-2} \quad (3)$$

where the output of summer 120 is $x_i$; b1 is a constant multiplier 124 having a value of 1.4882; b2 is a constant multiplier 128 having a value of 0.5625; time delay 122 delays the calculated value of $x_i$ from equation 2 by one time period and time delay 128 delays the calculated value of $X_i$ by two time periods.

It should be noted that the output of summer 130, which is $b1 \cdot x_{i-1} + b2 \cdot x_{i-2}$, is subtracted from the output of summer 118.

The output of a summer 132 of high pass filter 109 may be defined by the following equation:

$$y_i = X_i + b3 \cdot Y_{i-1} - b4 \cdot y_{i-2} \tag{4}$$

where $y_i$ is the output of summer 132, b3 is a constant multiplier 136 having a value of 1.70630, b4 is a constant multiplier 140 having a value of 0.8407; time delay 134 delays the calculated value of $y_i$ from equation 4 by one time period and time delay 138 delays the calculated value of $y_i$ from equation 4 by two time periods.

It should be noted that the output of summer 142, which is $b3 \cdot y_{i-1} + b4 \cdot y_{i-2}$, is subtracted from the output of summer 120.

Each value of $y_i$ is then processed in accordance with the following equation:

$$T1_{i-2} := \text{round}\left(\frac{y_i}{M \cdot 4}\right) \tag{5}$$

wherein the function round of equation 5 rounds off to the nearest whole number the result of dividing $y_i$ from equation 4 by M·4. The following table illustrates a series of random numbers $T1_{i-2}$ generated by the computer program of Appendix A which implements high pass filter 109 of FIG. 14.

TABLE I

| Time | $I_i$ | $y_i$ | $T1_{i-2}$ |
|---|---|---|---|
| $t_0$ | 0 | 0 | |
| $t_1$ | 1 | 0 | |
| $t_2$ | $2.03 \cdot 10^3$ | $2.030589 \cdot 10^3$ | 0 |
| $t_3$ | 343 | $-4.947082 \cdot 10^3$ | $-1$ |
| $t_4$ | $1.676 \cdot 10^3$ | $1.0976093 \cdot 10^4$ | 1 |
| $t_5$ | 925 | $-1.791569 \cdot 10^4$ | $-2$ |
| $t_6$ | 858 | $2.6411804 \cdot 10^4$ | 3 |
| $t_7$ | 83 | $-3.4486963 \cdot 10^4$ | $-4$ |
| $t_8$ | 472 | $4.1529353 \cdot 10^4$ | 5 |
| $t_9$ | $1.273 \cdot 10^3$ | $-4.5018258 \cdot 10^4$ | $-5$ |
| $t_{10}$ | 390 | $4.5280638 \cdot 10^4$ | 6 |
| $t_{11}$ | 783 | $-4.0845933 \cdot 10^4$ | $-5$ |

For time $t_{12}$ the numerical value of $T1_{i-2}$ as calculated by the computer program of Appendix A is 4; the numerical value of $T1_{i-2}$ for time $t_{13}$ is $-3$ and the numerical value of $T1_{i-2}$ for time $t_{14}$ is 2. In a like manner, the numerical value of $T1_{i-2}$ for time $t_{15}$ is $-1$ and the numerical value of $T1_{i-2}$ for time $t_{16}$ is 1. As is best illustrated by FIG. 12, the range of the nyquist dither bits-provided by filter 109 range from about minus seven to about plus seven.

A twelve bit address is supplied to the A0–A12 inputs of pseudo-random number generator 34 with the ten least significant bits of the address being supplied by counter 32 to the A0–A10 inputs of generator 34, the eleventh bit of the address being supplied by the fuze active output terminal 35 of the missile's telemetry unit to the A11 input of generator 34 and the A12 input of generator 34 being connected via jumpers to either ground or +5 VDC.

When the missile's telemetry unit provides a logic one to the A11 input of generator 34, which is the eleventh bit of the address, circuit 20 will provide a three bit equivalent digital signal for each sample of the analog signal occurring at input terminal 22. Similarly, when a logic zero is supplied to the A11 input of generator 34 by the missile's telemetry system a one bit equivalent digital signal of the analog signal occurring at terminal 22 will be provided by circuit 20.

Figure 12:
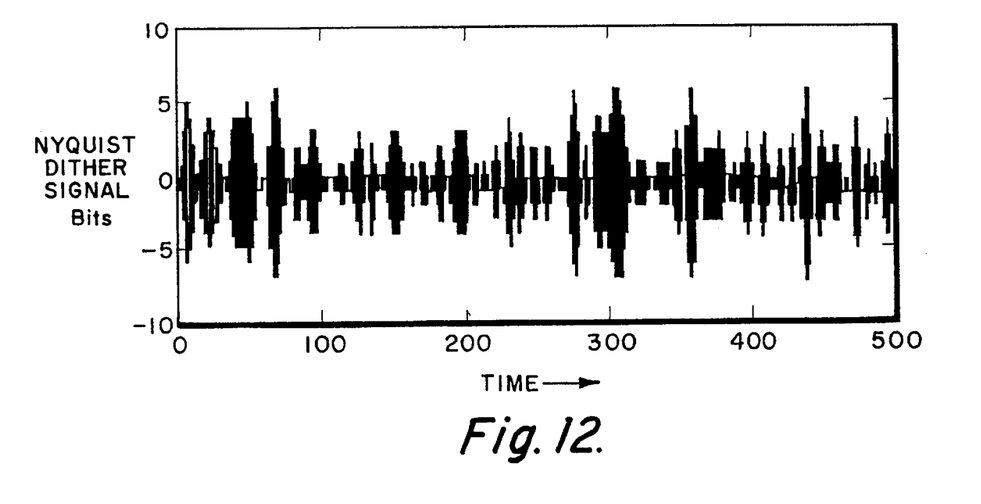
FIG. 12 illustrates the random numbers of FIG. 11 after being processed by the high pass filter of FIG. 14.
Figure 13:
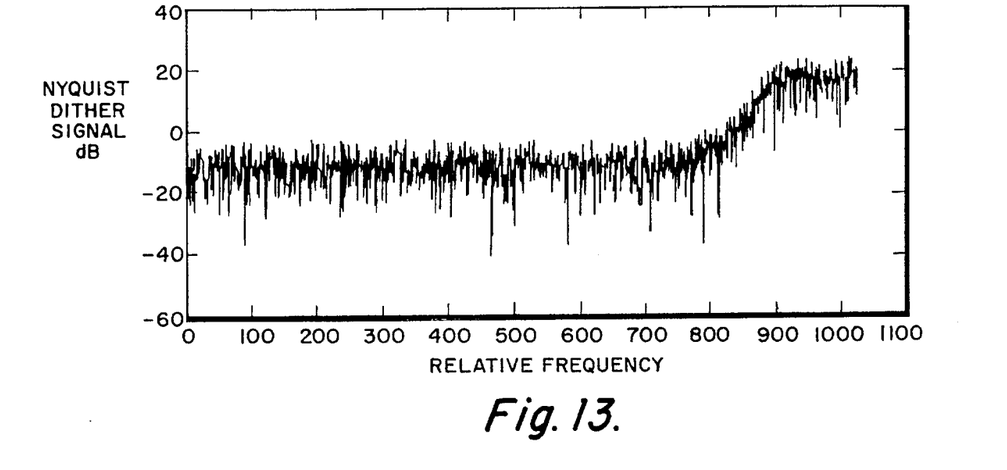
FIG. 13 is a spectrum analysis of the signal of FIG.

Each random number $T1_{i-2}$ generated by random number generator 34 has six bits which occurs at the DQ0–DQ5 outputs of generator 34 and may be either positive or negative as is best illustrated by FIG. 12 and Table I. The logic signal provided at the DQ7 output of generator 34 indicates whether the random number is positive or negative with a logic zero indicating that the random number is positive and a logic one indicating that the random number is negative. When the random number generated by random number generator 34 is a negative number, the two's number generator 34 is a negative number, the two's complement of the number will occur at the DQ0–DQ7 of generator 34.

It should be noted that the software of Appendix A provides for a Nyquist Centered Dither Function (line 54) and a 1 Bit Rectangular Probability Density Function (line 100). This occurs whenever the A12 input to pseudo-random number generator 34 is at the logic zero state. In the event it is desired to use a Triangular Probability Density Function a logic one may be supplied to the A12 input of generator 34.

A thorough discussion of Triangular and Rectangular Probability Density Functions in the generation of random numbers may be found in U.S. Pat. No. 5,311,180. The discussion in U.S. Pat. No. 5,311,180 relating to Triangular and Rectangular Probability Density Functions and their effect on random number generation as well the discussion relating to circuit 21 (FIG. 2) is incorporated by reference.

The reset input of counter 32 is connected to a minor frame flag output terminal 33 of the missile's telemetry unit. Terminal 33 provides a logic one pulse every 1920 counts of counter 32 so as to reset counter 32. Counter 32 will provide 1920 addresses to random number generator 34 which results in generator 34 providing at its DQ0–DQ5 outputs 1920 random numbers $T1_{i-2}$. It should be noted that the software of Appendix A is set to provide for a sequence of 2048 counts, that is M equals 2048 which results in 2048 random numbers $T1_{i-2}$ being loaded in generator 34. This, in turn, allows the user of electronics circuit 20 to generate up 2048 random numbers or dither for addition to the digital equivalent signal from converter 24 before the random number generation cycle is repeated.

At this time it should also be noted that the pseudo-random number generators 34 and 64 used in the preferred embodiment of the present invention are Texas Instruments 65,536 Bit Programmable Read Only Memory, Model Number TMS27C64 although it should be understood that any digital signal processing device which is capable of generating dither in the manner set forth above may be used as generator 34 and 64. It should also be noted that the binary adders 26, 28 and 66 used in the preferred embodiment of the present invention are Texas Instruments 4-Bit Binary Full Adders, Model Number SN45HC283.

Binary adders 26 and 28 introduce each six bit nyquist dither signal or word provided by generator 34 into each sample of the digital equivalent of the analog signal supplied to terminal 22 by the missile's telemetry system. It should be noted that the 600 KHz sampling rate utilized by analog to digital converter 24 to supply digital equivalent words to adders 26 and 28 is synchronized with the rate at which generator 34 supplies dither to adders 26 and 28.

For each digital sample of the analog signal supplied to terminal 22, binary counter 34 provides a three bit digital equivalent signal with nyquist dither at its sum 2, sum 3 and sum 4 outputs as well as a logic one carry bit indicating an overflow within adder 26. This three bit digital equivalent signal is supplied to a clipping circuit 36 which will process the three bit digital equivalent signal with dither in accordance with the following logic equations:

$$A = CO \cdot /DQ7 \quad (6)$$

$$B = CO + /DQ7 \quad (7)$$

where A indicates whether the three bit digital equivalent signal will pass through OR gates 38, 40 and 42 and B indicates whether the three bit digital equivalent signal will pass through AND gates 44, 46 and 48.

When DQ7 of generator 34 is at the logic zero state indicating a positive nyquist dither value and the carry output of binary adder 26 is at the logic zero state, a logic one will occur at the output of OR gate 52. This logic one is then inverted by inverter 54 so that logic zeros are supplied to the first inputs of OR gates 38, 40 and 42 allowing the three bit digital equivalent signal from the sum 2, sum 3 and sum 4 outputs of binary adder 26 to pass through OR gates 38, 40 and 42. Since the DQ7 output of generator 34 is at the logic zero state, the output of AND gate 56 is also at the logic zero state resulting in a logic one at the output of inverter 58. This logic one is supplied to AND gates 44, 46 and 48 thereby enabling AND gates 44, 46 and 48 which allows the three bit digital equivalent signal to pass through AND gates 44, 46 and 48 to the D0, D1 and D2 outputs of circuit 20.

In a like manner, whenever the CO output of binary adder 26 is at the logic one state and the DQ7 output of generator 34 is at the logic one state the three bit digital equivalent signal will pass from the sum 2, sum 3 and sum 4 outputs of binary adder 26 respectively through OR gates 38, 40 and 42 and AND gates 44, 46 and 48 to the D0, D1 and D2 outputs of circuit 20. This indicates that the three bit digital equivalent signal with nyquist dither occurring at the sum 2, sum 3 and sum 4 outputs of binary adder 26 is positive even though a negative binary value for nyquist dither was added to the six bit digital word provided by analog to digital converter 24.

However, when the carry output of binary adder 26 is at the logic one state and the DQ7 output of generator 34 is at the logic zero state, the output of OR gate 52 will be at the logic zero state. This logic zero is inverted by inverter 54 and then supplied to OR gates 38, 40 and 42 resulting in logic ones occurring at the outputs OR gates 38, 40 and 42 which are then provided to AND gates 44, 46 and 48. Since the output of AND gate 56 is at the logic zero state, inverter 58 will supply a logic one to AND gates 44, 46 and 48 which will each pass a logic one therethrough resulting in logic ones occurring at the D0, D1 and D2 outputs of circuit 20. This is the maximum three bit digital equivalent signal with nyquist dither that circuit 20 can provide for a digital sample of the analog signal supplied to terminal 22.

Further, when the carry output of adder 26 is at the logic zero state and the DQ7 output of generator 34 is a logic one the negative binary value of the nyquist dither signal generated by generator 34 will exceed the positive value of the six bit digital equivalent word from analog to digital converter 24 resulting in a negative binary number being provided by binary adders 26 and 28. Inverter 50 inverts the logic zero supplied to the input thereof resulting in logic ones being supplied to the first and second inputs of AND gate 56 which, in turn, results in a logic one occurring at the output of AND gate 56. This logic one is next supplied to and then inverted by inverter 58 resulting in a logic zero being supplied to AND gates 44, 46 and 48 so as to inhibit AND gates 44, 46 and 48. Inhibiting AND gates 44, 46 and 48 results in clipping circuit 36 supplying logic zeros to the D0, D1 and D2 outputs of circuit 20.

Figure 9:
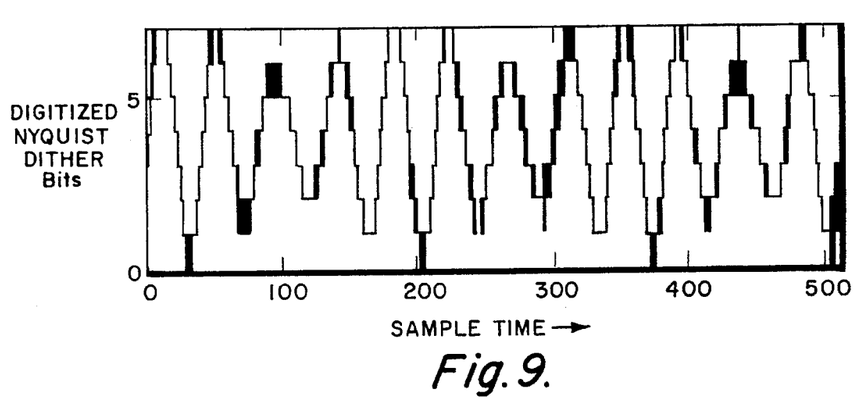
FIG. 9 illustrates the resultant digital signal after nyquist dither generated by the computer program of Appendix A is added to the digitized signal of FIG. 5.
Figure 10:
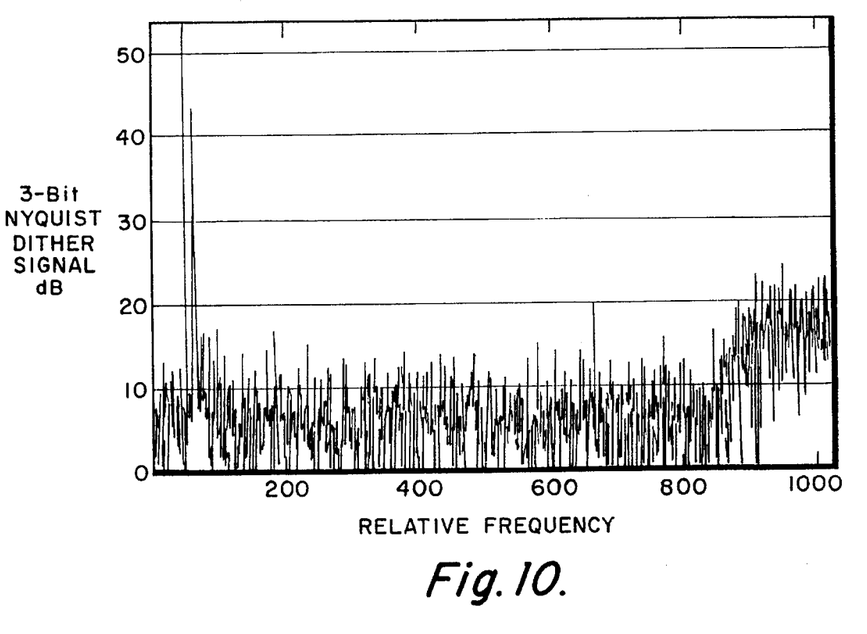
FIG. 10 is a spectrum analysis of the signal of FIG. 9.
Figure 11:
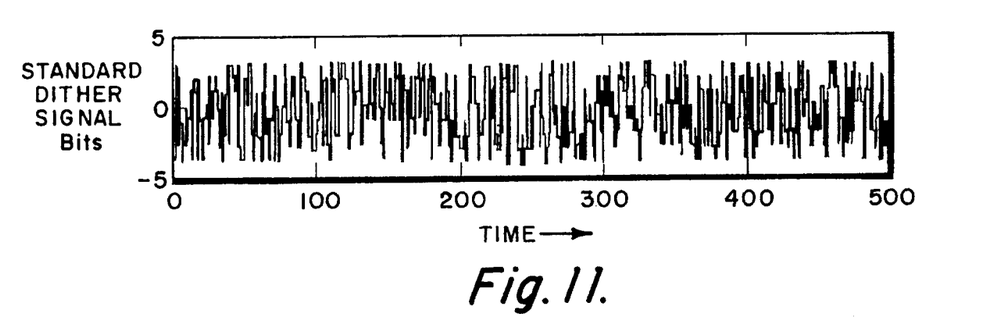
FIG. 11 illustrates the random numbers generated over time by the computer program of Appendix A.

The three bit digital equivalent digital signal with nyquist dither which occurs at the D0, D1 and D2 outputs of circuit 20 is supplied to packing logic within the missile's telemetry unit which prepares the three bit digital equivalent digital signal for transmission to a ground station by an antenna. The addition of nyquist dither to the digital equivalent signal from analog to digital converter 24 results in a three bit signal of the type illustrated generally by FIG. 9 being transmitted to the ground station. By adding nyquist dither to the digital equivalent signal from analog to digital converter 24 the need for circuit 21 is eliminated since the resultant analog signal with nyquist dither will be as clean over ninety percent of the pass band as an analog signal having its nyquist dither removed by the circuit 21 of FIG. 2.

Figure 2:
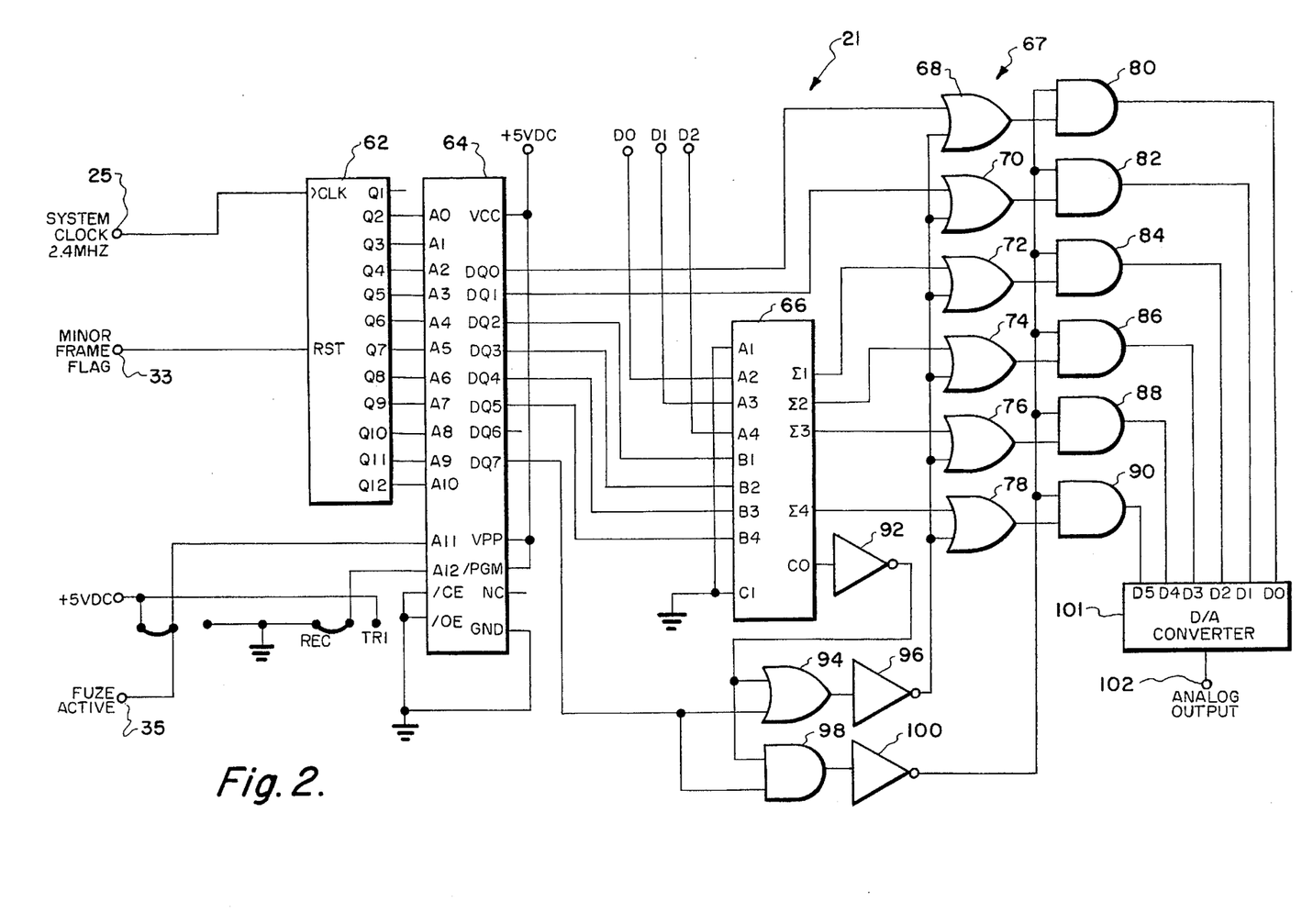
FIG. 2 is a circuit diagram of a digital circuit for the removal of dither from the digitized equivalent signal generated by the circuit of FIG. 1.
Figure 3:
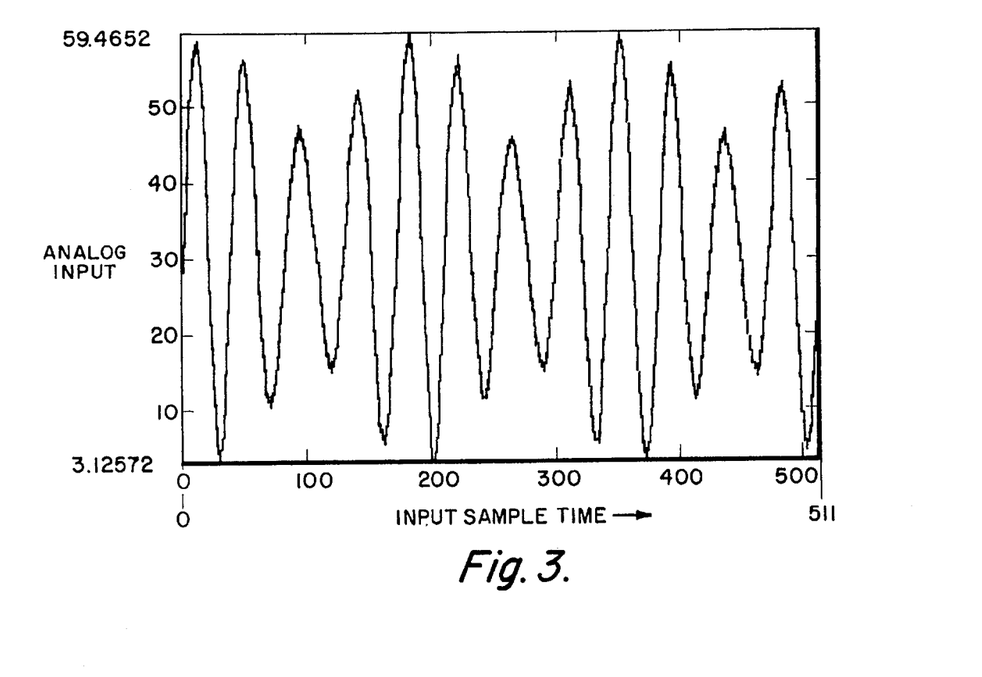
FIG. 3 illustrates the analog signal provided to the circuit of FIG. 1.
Figure 4:
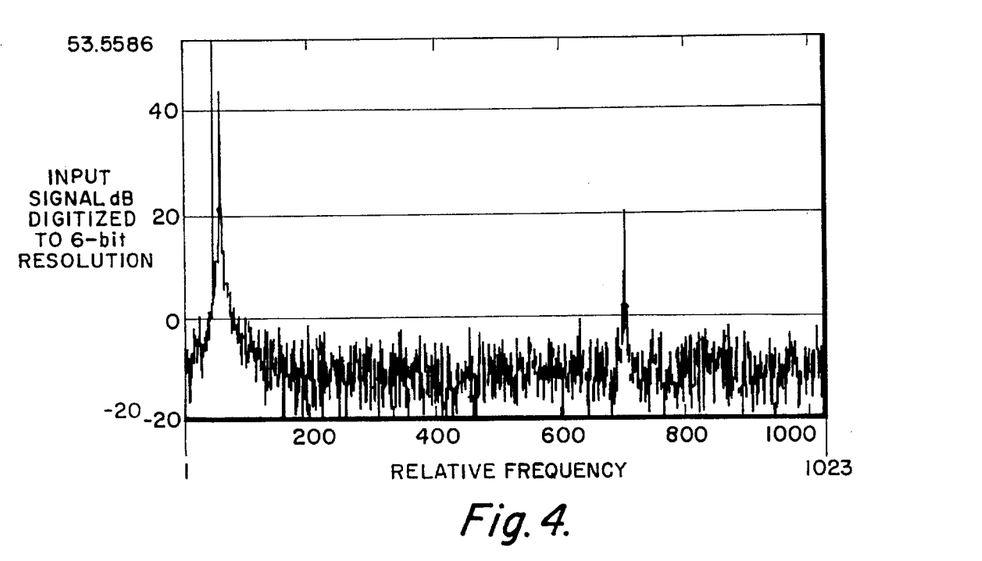
FIG. 4 illustrates a spectrum analysis of the analog signal of FIG. 3.
Figure 5:
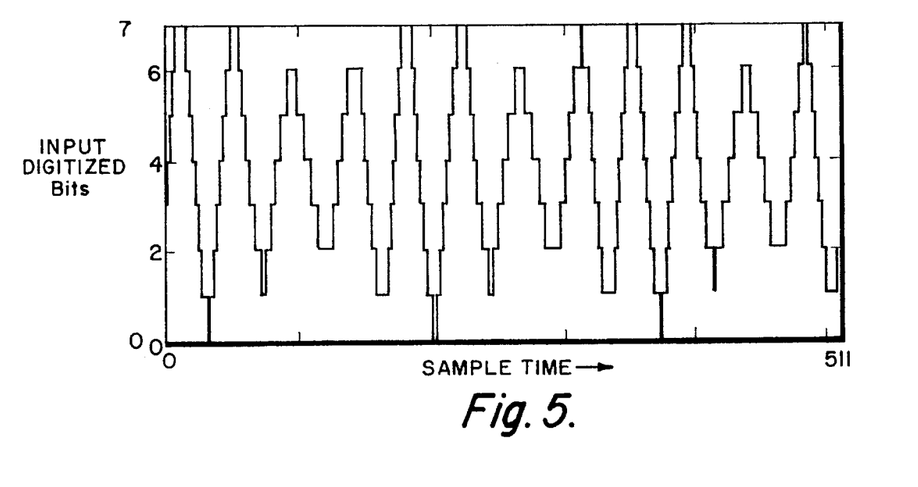
FIG. 5 illustrates the analog signal of FIG. 3 digitized to three bits by the circuit of FIG. 1.
Figure 6:
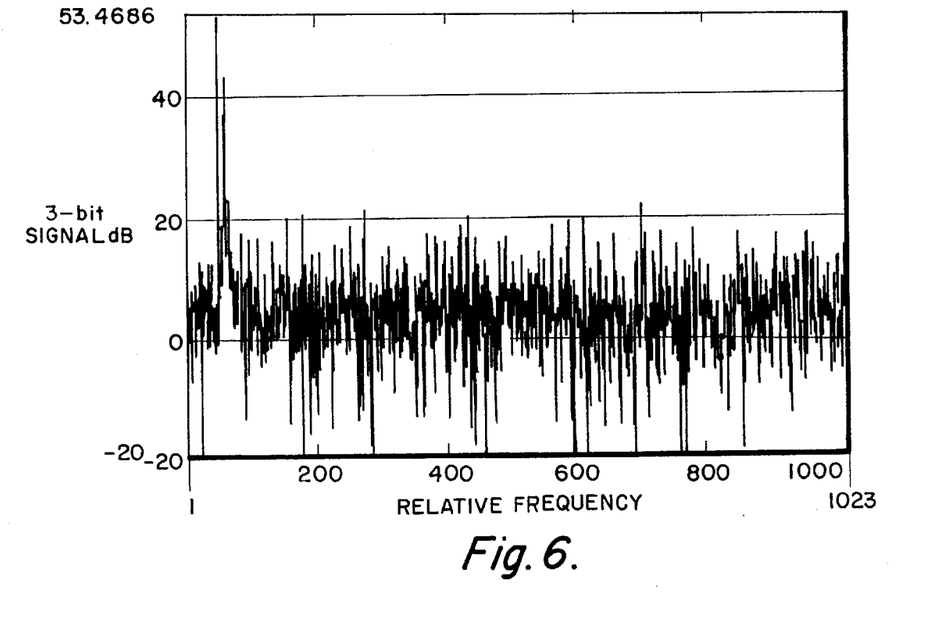
FIG. 6 illustrates a spectrum analysis of the digitized signal of FIG. 5.
Figure 7:
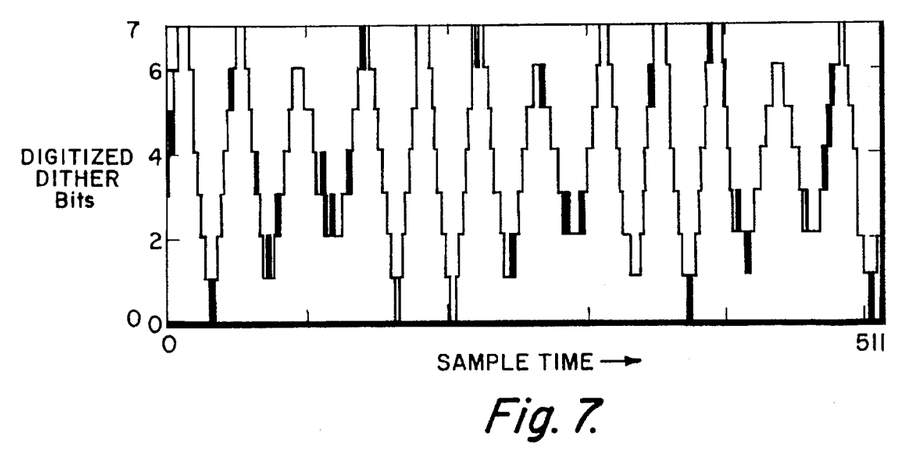
FIG. 7 illustrates the analog signal of FIG. 3 digitized to three bits with dither added thereto by the circuit of FIG. 1.
Figure 8:
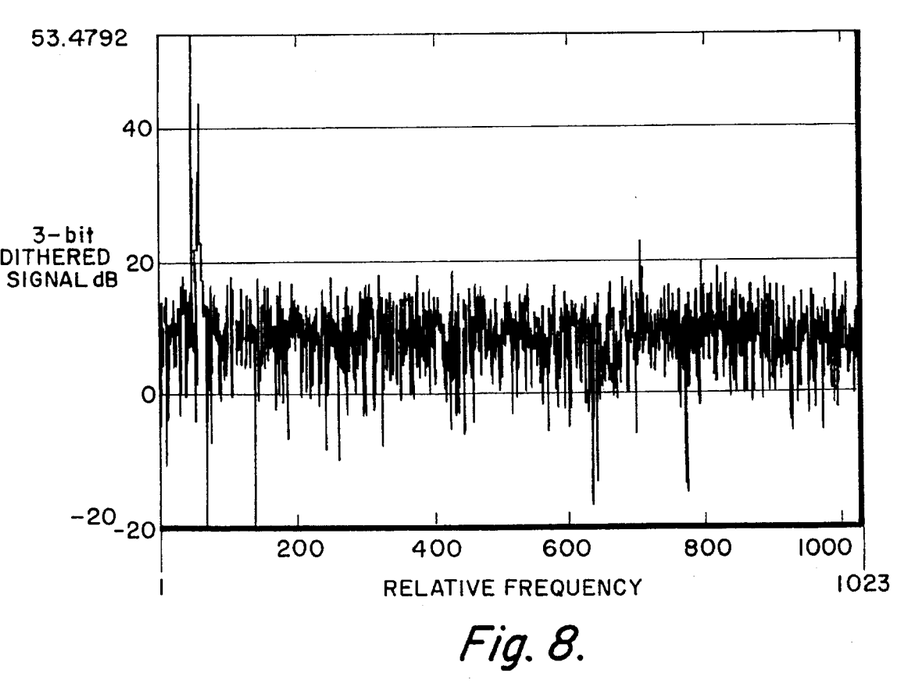
FIG. 8 is a spectrum analysis of the signal of FIG. 7.

However, it should be understood that the circuit of FIG. 2 can be used to eliminate the nyquist dither component from each digital sample provided by circuit 20 (FIG. 1) prior to its conversion to an analog form by digital to analog converter 101. For each binary random number generated by pseudo-random number generator 34, pseudo random number generator 64 would be required to generate a negative equivalent binary number delayed by a count of one clock pulse of the 600 KHz clock signal provided at the Q2 output of counter 34. The negative equivalent binary number generated by pseudo random number generator 64 is, in turn, the two's complement of the binary number generated by pseudo random number generator 34. U.S. Pat. No. 5,311,180 provides a complete discussion of the operation of circuit 21 for subtracting the dither component from each digital sample.

Although the present invention is described in terms of but one embodiment thereof, it needs to be recognized that the present invention could be embodied in other forms within the broad teachings set forth herein. The teachings of the present invention may be adapted to any audio recording or playback system which requires a truncating or a rounding operation to the digital equivalent signal. For instance, the teachings of the present invention may be adapted to a compact disk system, which requires twenty bit audio data to be requantized to 16 bits before storage on a compact disk.

From the foregoing, it may readily be seen that the present invention comprises a new, unique and exceedingly useful digital circuit which may be used to add dither to the digital equivalent of an analog signal and then later remove dither from the digital signal thereby reducing noise and distortion. Obviously, many modifications and variations of the present invention are possible in light of the above teachings. It is therefore to be understood that within the scope of the present claims the invention may be practiced otherwise than as specifically described.

Appendix A

```c
#include <stdio.h>
/* nqdither.c */
main () /* Calculates: A random number sequence of */
    /* length M. The output of which is filtered to contain */
    /* only the upper frequency components near the Nyquest */
    /* frequency. This is used for the three bit conversion. */
    /* In Addition the program creates a +/- 16 count */
    /* rectangular linear congruential random number */
    /* with a sequence length of M. This is used for one bit. */
    /* Usage: -> nqdither > ofile */
    /* Output is formated for download to a Unisite 40 Prom Programmer. */
{
  int M; /* Sequence Period */
  int J; /* Calculated multiplier factor 1 */
  int K; /* K multiplier factor 1 */
  int I[2052]; /* The Random Number in 11 bit resolution */
  float z[2052]; /* Output of 1st filter stage */
  float x[2052]; /* Output of 2nd filter stage */
  float y[2052]; /* Output of 3rd filter stage */
  int i; /* Index For the Random Number */
  unsigned char T1[2048]; /* Nyquest Dither random number sequence */
  unsigned char R[2048]; /* The Random Number rectangular to + and - X counts */
  float a1; /* Constant for filter tap 1 */
  float a2; /* Constant for filter tap 2 */
  float b1; /* Constant for filter tap 3 */
  float b2; /* Constant for filter tap 4 */
  float b3; /* Constant for filter tap 5 */
  float b4; /* Constant for filter tap 6 */
  unsigned char MR; /* Temporary Register */
  /* Initialization for rectangular 3 bit */
  K = 507; /* Set K multiplier */
  M = 2048; /* Set Length of sequence */
  I[0] = 0; /* Initialize The Random Sequence */
  J = 4*K+1; /* Calculate Multiplier Factor */
  for (i = 1; i < 2051; i++) /* Create Random Number Sequence */
    {
    I[i] = (J*I[i-1] + 1)%M; /* Modulus of Previous Random Number */
       /* Times the M.F., Plus 1 */
  /* Now filter rectangular signal for Nyquist centered dithering */
  /* Set-up filter Constants */
    a1 = 0.58899921;
    a2 = 0.64;
    b1 = 1.4882;
    b2 = 0.5625;
    b3 = 1.70630;
    b4 = 0.8407;
  /* Initialize first filter values */
    z[0] = 0;
    z[1] = 0;
    y[0] = 0;
    y[1] = 0;
    x[0] = 0;
    x[1] = 0;
  /* Calculate filter */
  for (i = 2; i < 2051; i++)
    {
    z[i] = I[i] + a1*I[i-1] + a2*I[i-2];
    x[i] = z[i] - b1*x[i-1] - b2*x[i-2];
    y[i] = x[i] - b3*y[i-1] - b4*y[i-2];
    }
  printf ("\2$A0000,"); /* Start formatting data for ASCII Hex space STX */
       /* Unisite format 50 */
  for (i = 0; i < 2048; i++)
    {
    I[i] = y[i+2]/(M*4); /* Create interger check value */
    T1[i] = y[i+2]/(M*4); /* Create Character value */
    if (I[i] >= 0
       {
       printf("\n0%X", T1[i]); /* Positive */
       }
    if (I[i] < 0)
       {
       printf("\n0%X", T1[i]); /* Negative */
       }
    }
  /* Initialization for rectangular 1 bit */
  K = 109; /* Set K multiplier */
  M = 2048; /* Set Length of sequence */
```

Appendix A

```
I[0] = 2011; /* Initialize The Random Sequence */
J = 4*K+1; /* Calculate Multiplier Factor M.F. */
R[0] = I[0]/(M/32) - 16; /* Calculate first random number */
printf ("\n\n$A0800,");
    /* Start address for 2nd page */
printf("\n0%X", R[0]); /* Print First Random Number */
for (i = 1; i < M; i++)
    {
    I[i] = (J*I[i-1] + 1)%M; /* Modulus of Previous Random Number */
        /* Times the M.F., Plus 1 */
    R[i] = I[i]/(M/32); /* Clip to Plus 32 */
    if ( R[i] >= 16) /* format data for correct ASCII Hex output */
        {
        MR = R[i] - 16; /* 0 to 15 */
        printf("\n0%X", MR);
        }
    if ( R[i] < 16)
        {
        R[i] = (R[i] - 16); /* -1 to -16 */
        printf("\n%X", R[i]);
        }
    }
    printf("\3\n$SE332,\n"); /* sum check for Data I/O */
}
```

What is claimed is:

1. A circuit for faithfully converting a first analog data signal into an equivalent digital signal, said circuit having a first clock signal of a first predetermined frequency provided thereto, said circuit comprising:

first converting means for receiving said first analog data signal and then converting said first analog data signal into said equivalent digital signal;

said equivalent digital signal having a plurality of digital data samples, each of said digital data samples having a plurality of data bits;

counting means responsive to said first clock signal providing a second clock signal having a second predetermined frequency, and a plurality of digital addresses;

said second clock signal being supplied to said converting means so as to effect the frequency at which said converting means samples said first analog data signal;

random number generating means responsive to said digital addresses provided by said first counting means generating a periodic sequence of random binary numbers, each of said random binary numbers generated by said first random number generating means being a nyquist dither component to be added to one digital data sample of said equivalent digital signal, said first random number generating means providing for each random binary number generated thereby a sign bit indicative of whether said random binary number is positive or negative;

high pass filtering means having an input for receiving an externally generated sequence of positive integers, said high pass filtering means processing said externally generated sequence of positive integers to provide said periodic sequence of said random binary numbers, said periodic sequence of said random binary numbers being loaded into said random number generating means;

adding means for adding said nyquist dither components to said digital data samples of said equivalent digital signal and for eliminating at least one bit from each of said digital data samples after said nyquist dither components are added thereto, said adding means providing a carry bit indicative of when the magnitude of any of said digital data samples exceeds the maximum value of the binary number which may be provided by said adding means after said adding means adds said nyquist dither component to said digital data sample;

clipping circuit means for receiving each digital data sample of said equivalent digital signal from said adding means, said clipping circuit means responsive to said carry bit provided by said adding means and said sign bit provided by said first random number generating means allowing said digital data sample to pass therethrough or setting each data bit of said digital data sample to a predetermined logic state; and second converting means for receiving each digital data sample of said equivalent digital signal from said clipping circuit means and converting each digital data sample of said equivalent digital signal into a second analog data signal, said second analog data signal including said nyquist dither components;

said high pass filtering means including:

a first time delay (110) having an input for receiving said externally generated sequence of positive integers and an output;

a second time delay (112) having an input connected to the output of said first time delay (110) and an output;

a first constant multiplier (114) having an input connected to the output of said first time delay (112) and an output;

a second constant multiplier (116) having an input connected to the output of said second time delay (112) and an output;

a first summer (118) having a first input for receiving said externally generated sequence of positive integers, a second input connected to the output of said first constant multiplier (114), a third input connected to the output of said second constant multiplier (116) and an output;

a second summer (120) having a positive input connected to the output of said first summer (118), a negative input and an output;

a third time delay (122) having an input connected to the output of said second summer (120) and an output;

a fourth time delay (126) having an input connected to the output of said third time delay (122) and an output;

a third constant multiplier (124) having an input connected to the output of said third time delay (122) and an output;

a fourth constant multiplier (128) having an input connected to the output of said fourth time delay (126) and an output;

a third summer (130) having a first positive input connected to the output of said third constant multiplier (124), a second positive input connected to the output of said fourth constant multiplier (128) and an output connected to the negative input of said second summer (120);

a fourth summer (132) having a positive input connected to the output of said second summer (120), a negative input and an output;

a fifth time delay (134) having an input connected to the output of said fourth summer (132) and an output;

a sixth time delay (138) having an input connected to the output of said fifth time delay (138) and an output;

a fifth constant multiplier (136) having an input connected to the output of said fifth time delay (134) and an output;

a sixth constant multiplier (140) having an input connected to the output of said sixth time delay (138) and an output;

a fifth summer (142) having a first positive input connected to the output of said fifth constant multiplier (136), a second positive input connected to the output of said sixth constant multiplier (140) and an output connected to the negative input of said fourth summer (132).

2. The circuit of claim 1 wherein said first converting means comprises an analog to digital converter.

3. The circuit of claim 1 wherein said counting means each comprises an asynchronous twelve bit counter.

4. The circuit of claim 1 wherein said random number generating means comprises a programmed read only memory.

5. The circuit of claim 1 wherein said first constant multiplier (114) has a numerical value of 0.58899921, said second constant multiplier (116) has a numerical value of 0.64, said third constant multiplier (124) has a numerical value of 1.4882, said fourth constant multiplier (128) has a numerical value of 0.5625, said fifth constant multiplier (136) has a numerical value of 1.70630 and said sixth constant multiplier (140) has a numerical value of 0.8407.

6. The circuit of claim 1 wherein said adding means comprises first and second four bit binary full adders, said first four bit binary full adder having a carry output and said second four bit binary full adder having a carry input, the carry output of said first four bit binary full adder being connected to the carry input of said second four bit binary full adder.

7. The circuit of claim 1 wherein said clipping circuit means comprises:

a first inverter having an input adapted to receive the carry bit from said adding means and an output;

a first OR gate having a first input connected to the output of said first inverter, a second input adapted to receive the sign bit from said random number generating means and an output;

a first AND gate having a first input connected to the output of said first inverter, a second input adapted to receive the sign bit from said random number generating means and an output;

a second inverter having an input connected to the output of said first OR gate and an output;

a third inverter having an input connected to the output of said first AND gate and an output;

second, third and fourth OR gates, each of said second, third and fourth OR gates having a first input connected to the output of said second inverter, a second input adapted to receive one of the data bits of said equivalent digital signal from said adding means and an output; and second, third and fourth AND gates, each of said second, third and fourth AND gates having a first input connected to the output of said third inverter, a second input connected to the output of one of said second, third or fourth OR gates and an output connected to said second converting means.

8. The circuit of claim 1 wherein said periodic sequence of random binary numbers comprises 2048 random binary numbers.

9. The circuit of claim 1 wherein said second converting means comprises a digital to analog converter.

10. The circuit of claim 1 wherein said periodic sequence of random binary numbers have a maximum binary value of plus seven and a minimum binary value of minus seven.

11. A circuit for faithfully converting a first analog data signal into an equivalent digital signal, said circuit having a first clock signal of a first predetermined frequency provided thereto, said circuit comprising:

an analog to digital converter for receiving said first analog data signal and then converting said first analog data signal into said equivalent digital signal;

said equivalent digital signal having a plurality of digital data samples, each of said digital data samples having a plurality of data bits;

an asynchronous twelve bit counter responsive to said first clock signal providing a second clock signal having a second predetermined frequency, and a plurality of digital addresses;

said second clock signal being supplied to said analog to digital converter so as to effect the frequency at which said analog to digital converter samples said first analog data signal;

a programmed read only memory coupled to said asynchronous twelve bit counter, said programmed read only memory responsive to said digital addresses provided by said asynchronous twelve bit counter generating a periodic sequence of random binary numbers, each of said random binary numbers generated by said programmed read only memory being a nyquist dither component to be added to one digital data sample of said equivalent digital signal, said programmed read only memory providing for each random binary number generated thereby a sign bit indicative of whether said random binary number is positive or negative;

high pass filtering means having an input for receiving an externally generated sequence of positive integers, said high pass filtering means processing said externally generated sequence of positive integers to provide said periodic sequence of said random binary numbers, said periodic sequence of random binary numbers being loaded into said programmed read only memory;

a binary adder coupled to said analog to digital converter and said programmed read only memory for receiving digital data samples of said equivalent digital signal and said nyquist dither components, said binary adder adding said nyquist dither components to said digital data samples of said equivalent digital signal and eliminating at least one bit from each of said digital data samples after said nyquist dither components are added thereto, said binary adder providing a carry bit indicative of when the magnitude of any of said digital data samples exceeds the maximum value of the binary number which may be provided by said binary adder after said binary adder adds said nyquist dither component to said digital data sample;

a clipping circuit for receiving each digital data sample of said equivalent digital signal from said binary adder, said clipping circuit responsive to said carry bit provided by said binary adder and said sign bit provided by said programmed read only memory allowing said digital data sample to pass therethrough or setting each data bit of said digital data sample to a predetermined logic state; and a digital to analog converter coupled to said clipping circuit for receiving each digital data sample of said equivalent digital signal from said clipping circuit and converting each digital data sample of said equivalent digital signal into a second analog data signal, said second analog data signal including said nyquist dither components.

12. The circuit of claim 11 wherein said binary adder comprises first and second four bit binary full adders, said first four bit binary full adder having a carry output and said second four bit binary full adder having a carry input, the carry output of said first four bit binary full adder being connected to the carry input of said second adder.

13. The circuit of claim 11 wherein said clipping circuit comprises:

a first inverter having an input adapted to receive the carry bit from said binary adder and an output;

a first OR gate having a first input connected to the output of said first inverter, a second input adapted to receive the sign bit from said programmed read only memory and an output;

a first AND gate having a first input connected to the output of said first inverter, a second input adapted to receive the sign bit from said programmed read only memory and an output;

a second inverter having an input connected to the output of said first OR gate and an output;

a third inverter having an input connected to the output of said first AND gate and an output;

second, third and fourth OR gates, each of said second, third and fourth OR gates having a first input connected to the output of said second inverter, a second input adapted to receive one of the data bits of said equivalent digital signal from said binary adder and an output; and second, third and fourth AND gates, each of said second, third and fourth AND gates having a first input connected to the output of said third inverter, a second input connected to the output of one of said second, third or fourth OR gates and an output connected to said digital to analog converter.

14. The circuit of claim 11 wherein said periodic sequence of random binary numbers comprises 2048 random binary numbers.

15. The circuit of claim 11 wherein said periodic sequence of random binary numbers have a maximum binary value of plus seven and a minimum binary value of minus seven.

16. A circuit for faithfully converting a first analog data signal into an equivalent digital signal, said circuit having a first clock signal of a first predetermined frequency provided thereto, said circuit comprising:

an analog to digital converter for receiving said first analog data signal and then converting said first analog data signal into said equivalent digital signal;

said equivalent digital signal having a plurality of digital data samples, each of said digital data samples having a plurality of data bits;

an asynchronous twelve bit counter responsive to said first clock signal providing a second clock signal having a second predetermined frequency, and a plurality of digital addresses;

said second clock signal being supplied to said analog to digital converter so as to effect the frequency at which said analog to digital converter samples said first analog data signal;

a programmed read only memory coupled to said asynchronous twelve bit counter, said programmed read only memory responsive to said digital addresses provided by said asynchronous twelve bit counter generating a periodic sequence of random binary numbers, each of said random binary numbers generated by said programmed read only memory being a nyquist dither component to be added to one digital data sample of said equivalent digital signal, said programmed read only memory providing for each random binary number generated thereby a sign bit indicative of whether said random binary number is positive or negative;

high pass filtering means having an input for receiving an externally generated sequence of positive integers, said high pass filtering means processing said externally generated sequence of positive integers to provide said periodic sequence of said random binary numbers, said periodic sequence of said random binary numbers being loaded into said programmed read only memory;

a binary adder coupled to said analog to digital converter and said programmed read only memory for receiving digital data samples of said equivalent digital signal and said nyquist dither components, said binary adder adding said nyquist dither components to said digital data samples of said equivalent digital signal and eliminating at least one bit from each of said digital data samples after said nyquist dither components are added thereto, said binary adder providing a carry bit indicative of when the magnitude of any of said digital data samples exceeds the maximum value of the binary number which may be provided by said binary adder after said binary adder adds said nyquist dither component to said digital data sample;

a clipping circuit for receiving each digital data sample of said equivalent digital signal from said binary adder, said clipping circuit responsive to said carry bit provided by said binary adder and said sign bit provided by said programmed read only memory allowing said digital data sample to pass therethrough or setting each data bit of said digital data sample to a predetermined logic state; and a digital to analog converter coupled to said clipping circuit for receiving each digital data sample of said equivalent digital signal from said clipping circuit and converting each digital data sample of said equivalent digital signal into a second analog data signal, said second analog data signal including said nyquist dither components;

said high pass filtering means comprising:

a first time delay (110) having an input for receiving said externally generated sequence of positive integers and an output;

a second time delay (112) having an input connected to the output of said first time delay 110 and an output;

a first constant multiplier (114) having an input connected to the output of said first time delay (112) and an output;

a second constant multiplier (116) having an input connected to the output of said second time delay (112) and an output;

a first summer (118) having a first input for receiving said externally generated sequence of positive integers, a second input connected to the output of said first constant multiplier (114), a third input connected to the output of said second constant multiplier 116 and an output;

a second summer (120) having a positive input connected to the output of said first summer (118), a negative input and an output;

a third time delay (122) having an input connected to the output of said second summer (120) and an output;

a fourth time delay (126) having an input connected to the output of said third time delay (122) and an output;

a third constant multiplier (124) having an input connected to the output of said third time delay (122) and an output;

a fourth constant multiplier (128) having an input connected to the output of said fourth time delay (126) and an output;

a third summer (130) having a first positive input connected to the output of said third constant multiplier (124), a second positive input connected to the output of said fourth constant multiplier (128) and an output connected to the negative input of said second summer (120);

a fourth summer (132) having a positive input connected to the output of said second summer (120), a negative input and an output;

a fifth time delay (134) having an input connected to the output of said fourth summer (132) and an output;

a sixth time delay (138) having an input connected to the output of said fifth time delay (138) and an output;

a fifth constant multiplier (136) having an input connected to the output of said fifth time delay (134) and an output;

a sixth constant multiplier (140) having an input connected to the output of said sixth time delay (138) and an output; and a fifth summer (142) having a first positive input connected to the output of said fifth constant multiplier (136), a second positive input connected to the output of said sixth constant multiplier (140) and an output connected to the negative input of said fourth summer (132);

the output of said fifth summer (142) providing said periodic sequence of random binary numbers.

17. The circuit of claim 16 wherein said first constant multiplier (114) has a numerical value of 0.58899921, said second constant multiplier (116) has a numerical value of 0.64, said third constant multiplier 124 has a numerical value of 1.4882, said fourth constant multiplier (128) has a numerical value of 0.5625, said fifth constant multiplier (136) has a numerical value of 1.70630 and said sixth constant multiplier (140) has a numerical value of 0.8407.

18. The circuit of claim 16 wherein said periodic sequence of random binary numbers comprises 2048 random binary numbers.

19. The circuit of claim 16 wherein said periodic sequence of random binary numbers have a maximum binary value of plus seven and a minimum binary value of minus seven.

* * * * *